United States Patent
Kim et al.

(10) Patent No.: US 7,295,054 B2
(45) Date of Patent: Nov. 13, 2007

(54) BUFFER CAPABLE OF CONTROLLING SLEW RATE IN DRIVE IC

(75) Inventors: Byung-Hoon Kim, Seoul (KR); Kyoung-Soo Kwon, Kyunggi-Do (KR); Chae-Dong Go, Kyunggi-Do (KR); Chan-Woo Park, Kyunggi-Do (KR)

(73) Assignee: Samsung Electro-Mechanics Co., Ltd, Kyunggi-Do (KR)

( * ) Notice: Subject to any disclaimer, the term of this patent is extended or adjusted under 35 U.S.C. 154(b) by 0 days.

(21) Appl. No.: 10/990,863

(22) Filed: Nov. 18, 2004

(65) Prior Publication Data
US 2006/0049858 A1    Mar. 9, 2006

(30) Foreign Application Priority Data
Sep. 6, 2004    (KR) .................. 10-2004-0070980

(51) Int. Cl.
*H03K 5/12* (2006.01)
(52) U.S. Cl. ............ 327/170; 327/380; 327/381; 327/382; 327/263; 327/284
(58) Field of Classification Search .......... None
See application file for complete search history.

(56) References Cited

U.S. PATENT DOCUMENTS

| | | | |
|---|---|---|---|
| 4,390,850 A | 6/1983 | Davis et al. | 330/253 |
| 4,635,483 A * | 1/1987 | Mishiro | 73/579 |
| 5,231,360 A * | 7/1993 | Storey | 330/86 |
| 5,311,360 A | 5/1994 | Bloom et al. | 359/572 |
| 6,275,581 B1 * | 8/2001 | Fischer et al. | 379/398 |
| 6,492,924 B2 | 12/2002 | Copley et al. | 341/139 |

FOREIGN PATENT DOCUMENTS

| | | |
|---|---|---|
| JP | 63-135882 | 8/1988 |
| JP | 4-356816 | 10/1992 |
| JP | 11-58732 | 2/1999 |
| JP | 2004-78216 | 11/2004 |
| KR | 2003-77389 | 3/2003 |
| KR | 2004-048036 | 7/2004 |

* cited by examiner

*Primary Examiner*—Tuan T. Lam
*Assistant Examiner*—Hiep Nguyen
(74) *Attorney, Agent, or Firm*—Gottlieb, Rackman & Reisman, P.C.

(57) ABSTRACT

The present invention relates generally to a buffer of a drive Integrated Circuit (IC) and, more particularly, to a buffer of a drive IC for driving a spatial light modulator that can meet a desired dynamic slew rate characteristic by controlling current that affects a slew rate. The buffer capable of controlling the slew rate includes a first amplifier connected to the output terminal of the Digital/Analog (D/A) converter of an IC, and adapted to receive output voltage of the D/A converter and inversely amplify the output voltage, a second amplifier adapted to again inversely amplify output voltage that has been inversely amplified by the first amplifier, a charging means connected to the output and input terminals of the second amplifier, and adapted to be charged with the output voltage of the first amplifier, and a current control unit connected to the output terminal of the first amplifier and the input terminal of the second amplifier, and adapted to control the output voltage of the current control unit.

11 Claims, 6 Drawing Sheets

BUFFER CAPABLE OF CONTROLLING SLEW RATE IN DRIVE IC

BACKGROUND OF THE INVENTION

1. Field of the Invention

The present invention relates generally to a buffer of a drive integrated circuit and, more particularly, to a buffer of a drive integrated circuit for driving a spatial light modulator that can meet a desired dynamic slew rate characteristic by controlling current that affects a slew rate.

2. Description of the Related Art

Generally, an optical signal processing technology has advantages in that a great amount of data is quickly processed in a parallel manner unlike a conventional digital information processing technology in which it is impossible to process a great amount of data in real time. Studies have been conducted on the design and production of a binary phase filter, an optical logic gate, a light amplifier, an image processing technique, an optical device, and a light modulator using a spatial light modulation theory.

The spatial light modulator is applied to optical memory, optical display device, printer, optical interconnection and hologram fields, and studies have been conducted to develop a display device employing it.

The spatial light modulator is embodied by a reflective deformable grating light modulator 10 as shown in FIG. 1. The modulator 10 is disclosed in U.S. Pat. No. 5,311,360 by Bloom et al. The modulator 10 includes a plurality of reflective deformable ribbons 18, which have reflective surface parts, are suspterminaled on an upper part of a silicon substrate 16, and are spaced apart from each other at regular intervals. An insulating layer 11 is deposited on the silicon substrate 16. Subsequently, a sacrificial silicon dioxide film 12 and a low-stress silicon nitride film 14 are deposited.

The nitride film 14 is patterned by the ribbons 18, and a portion of the silicon dioxide film 12 is etched, thereby maintaining the ribbons 18 on the oxide spacer layer 12 by a nitride frame 20.

In order to modulate light having a single wavelength of $\lambda$, the modulator is designed so that thicknesses of the ribbon 18 and oxide spacer 12 are each $\lambda/4$.

Limited by a vertical distance (d) between a reflective surface 22 of each ribbon 18 and a reflective surface of the substrate 16, a grating amplitude of the modulator 10 is controlled by applying voltage between the ribbon 18 (the reflective surface 22 of the ribbon 18 acting as a first electrode) and the substrate 16 (a conductive layer 24 formed on a lower side of the substrate 16 to act as a second electrode).

In an undeformed state of the light modulator with no voltage application, the grating amplitude is $\lambda/2$ while a total round-trip path difference between light beams reflected from the ribbon and substrate is $\lambda$. Thus, a phase of reflected light is reinforced.

Accordingly, in the undeformed state, the modulator 10 acts as a plane mirror when it reflects incident light. In FIG. 2, the reference numeral 20 denotes the incident light reflected by the modulator 10 in the undeformed state.

When proper voltage is applied between the ribbon 18 and substrate 16, the electrostatic force enables the ribbon 18 to move downward toward the surface of the substrate 16. At this time, the grating amplitude is changed to $\lambda/4$. The total round-trip path difference is a half of a wavelength, and light reflected from the deformed ribbon 18 and light reflected from the substrate 16 are subjected to destructive interference.

The modulator diffracts incident light 26 using the interference. In FIG. 3, reference numerals 28 and 30 denote light beams diffracted in +/−diffractive modes (D+1, D−1) in the deformed state, respectively.

However, the light modulator by Bloom adopts an electrostatic method to control the position of a micromirror, which is disadvantageous in that operation voltage is relatively high (usually 30 V or so) and the relationship between the applied voltage and displacement is not linear, thus resulting in poor reliability in the control of light.

In order to solve such problems, "thin-film piezoelectric light modulator and method of manufacturing the same" is disclosed in Korean Pat. No. P2003-077389.

FIG. 4 is a cut-away view showing a recess type thin-film piezoelectric light modulator according to a conventional technology.

Referring to the drawing, the recess type thin-film piezoelectric light modulator according to the conventional technology includes silicon substrates 401 and elements 410.

In this case, the elements 410 may have a predetermined width, and be regularly arranged to constitute the recess type thin-film piezoelectric light modulator. Alternatively, such elements 410 may have different widths, and be alternately arranged to constitute the recess type thin-film piezoelectric light modulator. The elements 410 may be positioned to be spaced apart from each other by a predetermined interval (almost the same as the width of an element 410). In this case, micromirror layers formed on the entire top surfaces of the silicon substrates 401 diffract incident light by reflecting the incident light.

Each of the silicon substrates 401 includes a recess to provide an air space to an element 410, an insulating layer 402 is deposited on the top surface of the silicon substrate 401, and both sides of the element 410 are attached to both sides of the silicon substrate 401 outside the recess.

The element 410 is formed in a bar shape, and both sides thereof are attached to both sides of the silicon substrate 401 outside the recess of the silicon substrate 401. The element 410 includes a lower support 411 the portion of which positioned above the recess of the silicon substrate 401 can move vertically.

The element 410 includes a lower electrode layer 412 formed on the left side of the lower support 411 and adapted to provide piezoelectric voltage, a piezoelectric material layer 413 formed on the lower electrode layer 412 and adapted to generate a vertical actuating force through shrinkage and expansion when voltage is applied to both sides thereof, and an upper electrode layer 414 formed on the piezoelectric material layer 413 and adapted to provide piezoelectric voltage to the piezoelectric material layer 413.

Furthermore, the element 410 includes a lower electrode layer 412' formed on the right side of the lower support 411 and adapted to provide piezoelectric voltage, a piezoelectric material layer 413' formed on the lower electrode layer 412' and adapted to generate a vertical actuating force through shrinkage and expansion when voltage is applied to both sides thereof, and an upper electrode layer 414' formed on the piezoelectric material layer 413' and adapted to provide piezoelectric voltage to the piezoelectric material layer 413'.

A raised type light modulator different from the above-described recess type light modulator is described in detail in Korean Pat. No. P2003-077389.

Meanwhile, the drive Integrated Circuit (IC) of a spatial light modulator is used to drive the spatial light modulator.

Generally, the slew rate of driving voltage is important to drive the spatial light modulator in light of the characteristics of the spatial light modulator. In this case, the slew rate refers to a maximum variation of output voltage per unit time. That is, when output voltage is plotted against time on a graph, the instantaneous slope (differentiated value with respect to time) of an output voltage curve is the slew rate.

Generally, the higher the slew rate, the better.

However, an excessively high slew rate in the drive IC for driving the spatial light modulator causes a large amount of residual vibration in the spatial light modulator, thus increasing fatigue in the spatial light modulator.

Furthermore, an excessively low slew rate in the drive IC for driving the spatial light modulator can solve the problem of fatigue caused by residual vibration, but is problematic in that it is difficult to obtain a desired number of diffracted beams having different intensities at desired time because the drive IC is driven so slowly. Generally, the spatial light modulator is desired to be driven fast. In the case where the slew rate of the drive IC is too low, it is problematic in that the drive IC cannot be driven at a desired speed.

SUMMARY OF THE INVENTION

Accordingly, the present invention has been made keeping in mind the above problems occurring in the prior art, and an object of the present invention is to provide a buffer of a drive IC capable of controlling the slew rate of output voltage that can meet a desired dynamic slew rate characteristic by controlling current that affects the slew rate.

In order to accomplish the above object, the present invention provides a buffer capable of controlling a slew rate, including a first amplifier connected to the output terminal of the Digital/Analog (D/A) converter of a drive IC, and adapted to receive the output voltage of the D/A converter and inversely amplify the output voltage, a second amplifier adapted to again inversely amplify output voltage that has been inversely amplified by the first amplifier, a charging means connected to the output and input terminals of the second amplifier, and adapted to be charged with the output voltage of the first amplifier, and a current control unit connected to the output terminal of the first amplifier and the input terminal of the second amplifier, and adapted to control output voltage of the current control unit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
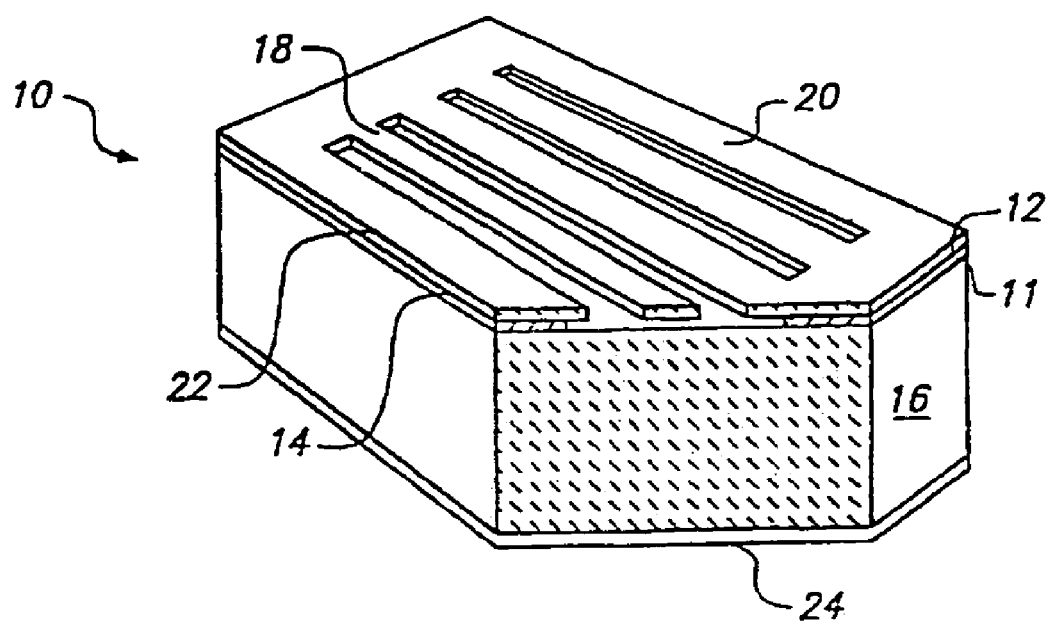
FIG. 1 is a perspective view illustrating a conventional electrostatic type grating light modulator.
Figure 2:
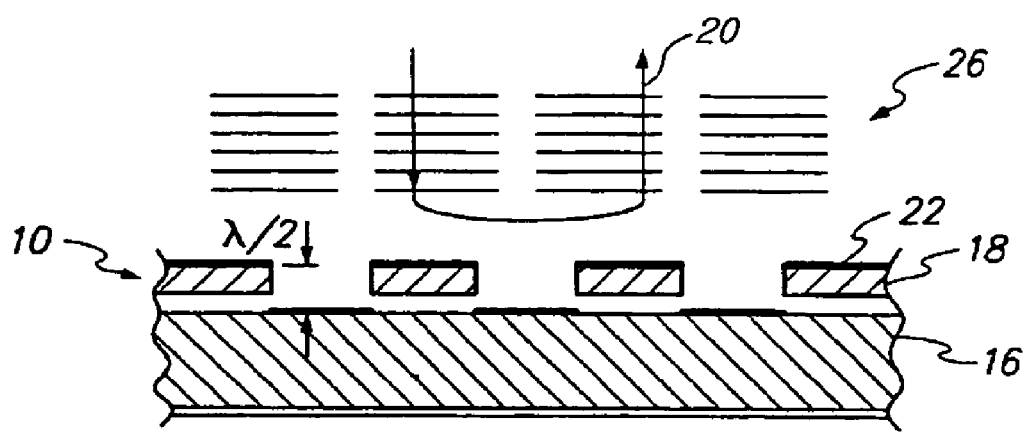
FIG. 2 is a view illustrating the reflection of incident light by the conventional electrostatic type grating light modulator.
Figure 3:
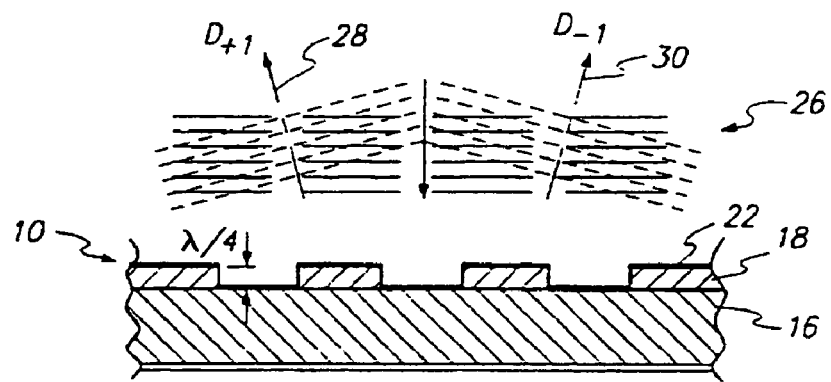
FIG. 3 is a view illustrating the diffraction of incident light by the conventional electrostatic type grating light modulator.
Figure 4:
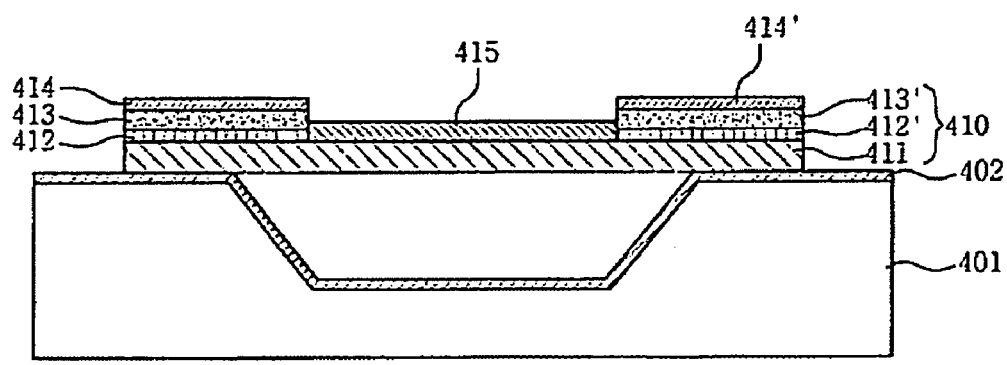
FIG. 4 is a sectional view showing a conventional diffractive thin-film piezoelectric micromirror having piezoelectric materials and a recess.

Reference now should be made to the drawings, in which the same reference numerals are used throughout the different drawings to designate the same or similar components.

A preferred embodiment of the present invention is described in detail with reference to FIGS. 5 to 11 below.

Figure 5:
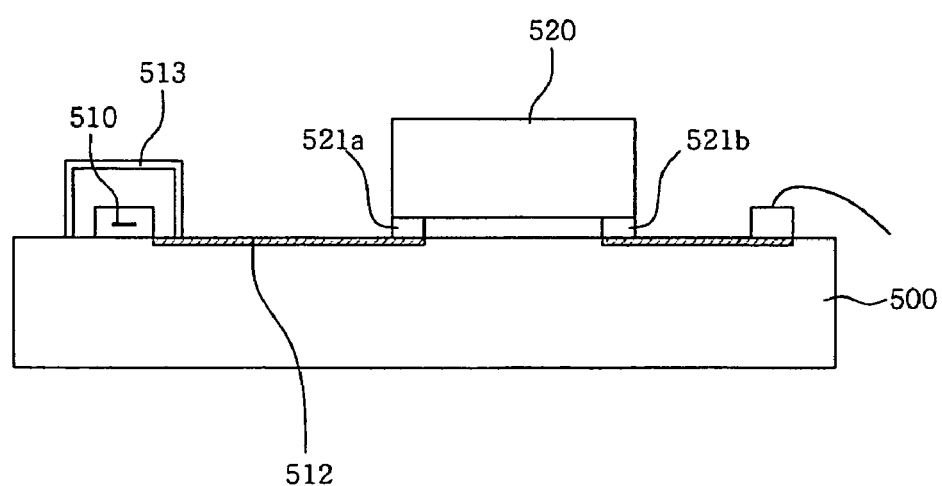
FIG. 5 is a sectional view showing the drive module of a light modulator using a buffer capable of controlling a slew rate in a drive IC according to an embodiment of the present invention.

FIG. 5 is a sectional view showing the drive module of a light modulator using a buffer capable of controlling a slew rate in a drive IC according to an embodiment of the present invention.

Referring to FIG. 5, the active element 510 of a spatial light modulator is formed on a portion of a lower substrate 500. In this case, a silicon substrate, ceramic substrate or Printed Circuit Board (PCB) can be used as the lower substrate 500.

The active element 510 of the spatial light modulator includes all the elements (active regions) of diffractive, reflective and transmissive light modulators used in the optical memory, optical display device, printer, optical interconnection, hologram, and display device fields.

The active element 510 of the spatial light modulator includes an active region 511 (element of light modulator) formed on a portion of the lower substrate 500 and adapted to move vertically when power is applied, a conductive electrode 512 adapted to supply power to the active region 511, and a lid glass 513 adapted to seal the active region 511.

The lid glass 513 functions to protect the active region 511, mounted on the lower substrate 500, from a surrounding environment. The lid glass 513 covers the active region 511, and a portion of the lid glass 513 corresponding to the active region 511 is made of light transmitting material.

A drive IC 520 is provided beside the active element 510 formed on the lower substrate 500. The drive IC 520 provides driving voltage to the active region 511 of the active element 510 in response to an externally applied control signal.

The electrical connection between the drive IC 520 and the active region 511 of the active element 510 is implemented using conductive electrodes 521a and 521b, and is maintained using a flip-chip connection.

The operation of the drive module of the light modulator is described in detail with reference to the drawings below.

The drive IC 520 receives a control signal for generating diffracted light using a corresponding pixel from an external control unit (not shown).

The drive IC 520 generates driving voltage that enables one or more elements (active regions), which constitute the corresponding pixel, to be moved upward or downward by $\lambda/4$ (The number of elements that must move is determined by the number of active regions constituting the corresponding pixel. That is, only a single element is driven if two elements constitute a single pixel, and two elements are driven if four elements constitute a single pixel), and applies the driving voltage to one or more elements (one or more active regions).

As described above, when the driving voltage is applied to one or more elements constituting the corresponding pixel, one or more elements constituting the corresponding pixel move upward or downward by λ/4 due to the applied driving voltage, and generate a height difference of λ/4 between themselves and neighboring elements so that the pixel corresponding to the active region 511 generates 0 and +/−1st order diffracted light when light is incident on the surface of the pixel.

Figure 6:
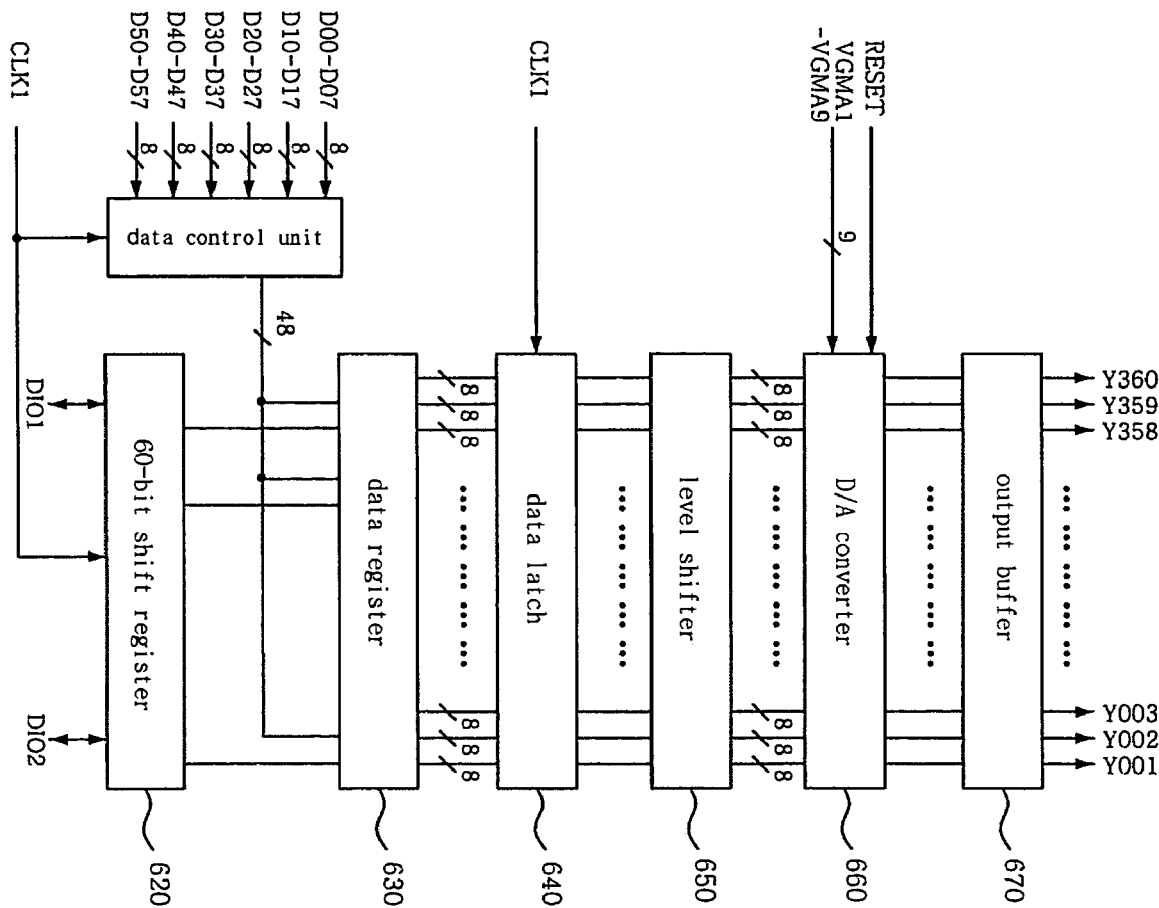
FIG. 6 is a view showing the internal construction of the drive IC of FIG. 5.

FIG. 6 is a view showing the internal construction of the drive IC of FIG. 5. Referring to the drawing, the drive IC of FIG. 5 includes a data control unit 610, a 60-bit shift register 620, a data register 630, a data latch 640, a D/A converter 660 and an output buffer 670.

In the present invention, the data control unit 610 receives six pieces of 8-bit data from an external control unit (not shown). The data control unit 610 transmits the six pieces of 8-bit data, received from the external control unit, to the data register 630 through an internal 48-bit line.

In this case, the 60-bit shift register 620 shifts the 48-bit data, transmitted from the data control unit 610, 60 times, thus allowing a total of 48*60-bit data to be stored in the data register 630. The reason for this is that a total of 360*8=2880-bit data is required because each channel is driven by 8 bits and 360 channels are used, so that 48-bit data is required to be shifted 60 times to store the 2880-bit data in the data register 630.

The data register 630 transmits the stored 48*60-bit data to the data latch 640 at one time when a clock is turned on. The data latch 640 outputs 48*60-bit data, which can drive 360 channels, to a level shifter 650.

The level shifter 650 shifts the level of a data signal, output from the data latch 640, from 3.3 to 15 V, and outputs the 15 V data signal to the D/A converter 660.

Thereafter, the D/A converter 660 receives the 15 V 8-bit data output from the level shifter 650, converts the 15 V 8-bit data into analog data, and outputs the analog data to the output buffer 670.

The output buffer 670 buffers the output voltage of the D/A converter 660, and provides the buffered output voltage to the corresponding element (the active region) of the spatial light modulator.

Figure 7:
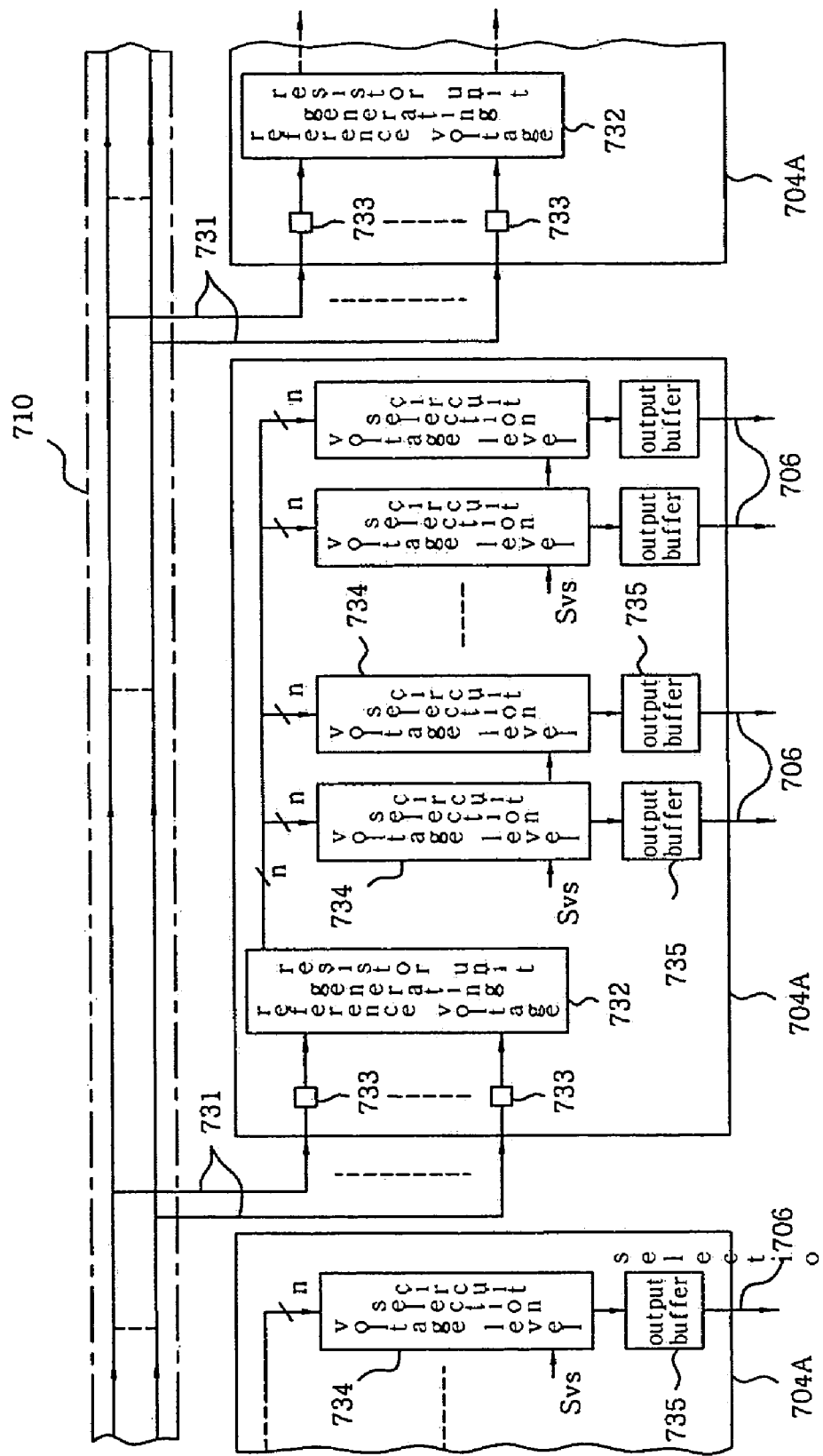
FIG. 7 is a view showing the internal construction of the D/A converter of FIG. 6.

FIG. 7 is a view showing the construction of the D/A converter 660 of FIG. 6.

Referring to FIG. 7, the D/A converter 660 of FIG. 6 includes pads 733 to which reference voltage lines 731 are mechanically connected, a reference voltage generating resistor unit 732 adapted to receive signals through the reference voltage lines 731 and generate subdivided reference voltages, a plurality of voltage level selection circuits 734 connected to the reference voltage generating resistor unit 732, and output buffers 735 placed behind the voltage level selection circuits 734, respectively.

The reference voltage generating resistor unit 732 divides externally input reference voltage into a desired number of reference voltages. The voltage level selection circuits 734 receive 8-bit digital data, and select and output a voltage value corresponding to the 8-bit digital data.

Figure 8:
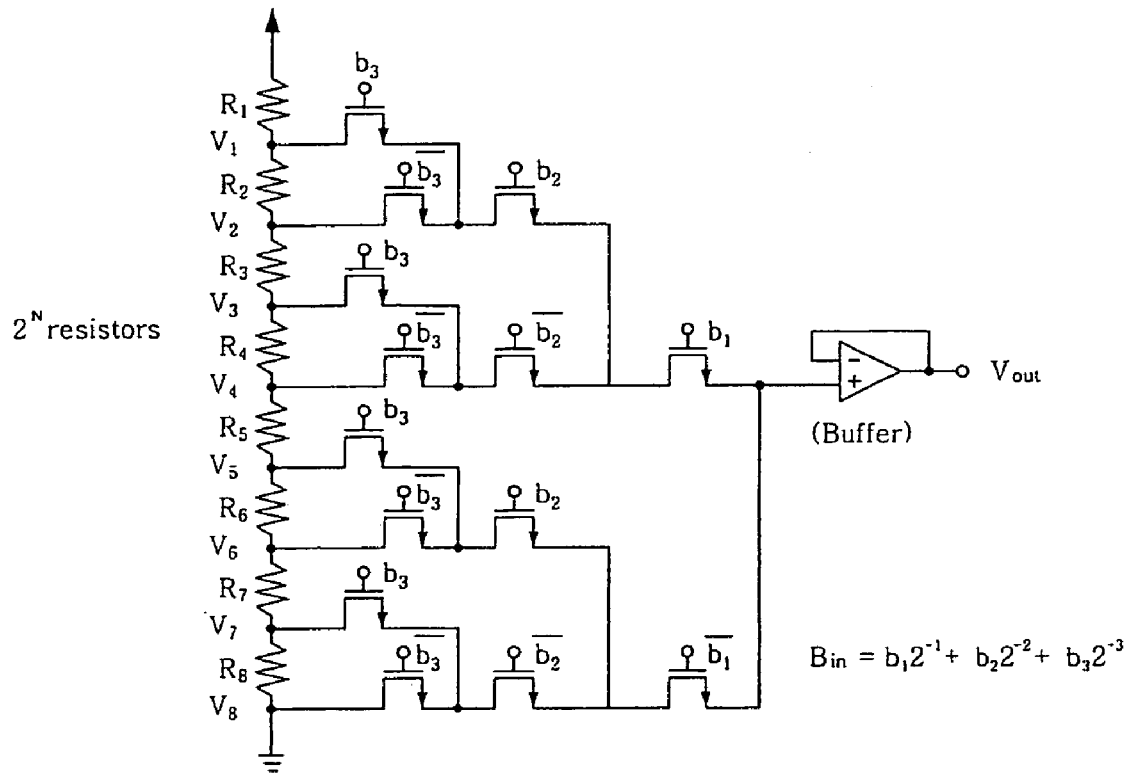
FIG. 8 is a circuit diagram of the D/A converter of FIG. 6.

FIG. 8 is a circuit diagram showing the D/A converter of FIG. 6 according to an embodiment of the present invention. FIG. 8 illustrates a process of selecting and outputting a voltage value corresponding to 3-bit digital data when the voltage level selection circuits 734 receive the 3-bit digital data.

Referring to FIG. 8, the D/A converter 660 of FIG. 6 includes a plurality of series-connected resistors R1 to R8 constituting the reference voltage generating resistor unit 732, and a plurality of tree-shaped transistors b1 to b3 and $\overline{b1}$ to $\overline{b3}$ constituting the voltage level selection circuits 734.

The series-connected resistors R1 to R8 of the reference voltage generating resistor unit 732 divide input voltage into eight voltages.

Furthermore, the tree-shaped transistors b1 to b3 and $\overline{b1}$ to $\overline{b3}$ select the eight divided input voltage. An example is shown in Table 1 with reference to the drawing below.

TABLE 1

| Input signal | b1 | b2 | b3 | Output voltage |
|---|---|---|---|---|
| 111 | 1 | 1 | 1 | V1 |
| 110 | 1 | 1 | 0 | V2 |
| 101 | 1 | 0 | 1 | V3 |
| 100 | 1 | 0 | 0 | V4 |
| 011 | 0 | 1 | 1 | V5 |
| 010 | 0 | 1 | 0 | V6 |
| 001 | 0 | 0 | 1 | V7 |
| 000 | 0 | 0 | 0 | V8 |

Figure 9:
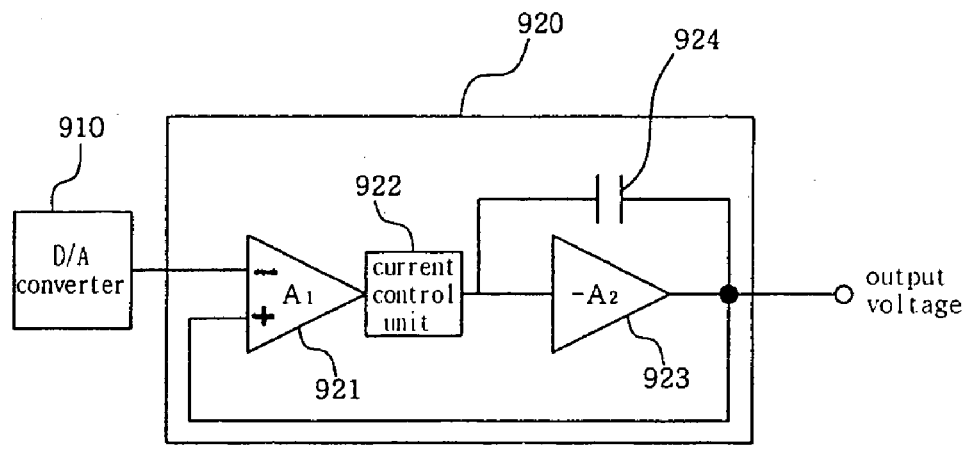
FIG. 9 is a view showing the construction of the buffer capable of controlling the slew rate according to the embodiment of the present invention.

FIG. 9 is a view showing the construction of a buffer capable of controlling a slew rate according to an embodiment of the present invention.

Referring to FIG. 9, the buffer capable of controlling a slew rate according to the embodiment of the present invention includes a front-stage amplifier 921, a current control unit 922, a back-stage inverting amplifier 923, and a capacitor 924.

The inverting terminal of the front-stage amplifier 921 is connected to the output terminal of a D/A converter 910, and the non-inverting terminal of the front-stage amplifier 921 is connected to the output terminal of the buffer.

Since the voltage difference between the inverting terminal and non-inverting terminal of the front-stage amplifier 921 is zero, the output voltage is the same as the voltage input to the inverting terminal. That is, the output voltage from the front-stage amplifier 921 is the same as the input voltage from the D/A converter 910 to the non-inverting terminal.

Furthermore, voltage is output through the output terminal of the front-stage amplifier 921 with the phase of the input voltage inversed. That is, phase inversion occurs in the front-stage amplifier 921.

The back-stage inverting amplifier 923 inverses the phase of input voltage and outputs voltage having an inversed phase. That is, the back-stage inverting amplifier 923 receives the output voltage of the front-stage amplifier 921, and inverses the phase of the voltage and outputs voltage having an inversed phase.

As a result, the phase of the input voltage of the front-stage amplifier 921 is inversed when the input voltage is output from the front-stage amplifier 921, and the phase of the output voltage of the front-stage amplifier 921 is inversed again when the output voltage passes through the back-stage inverting amplifier 923. Accordingly, the phase of the voltage output from the back-stage inverting amplifier 923 is finally identical with that of the input voltage of the front-stage amplifier 921.

The capacitor 924 is charged with the input voltage of the back-stage inverting amplifier 923 and is discharged from the charged voltage, thus varying the output voltage of an output terminal according to the input voltage.

In the buffer circuit, a slew rate is generally determined using Equation 1, $$\text{slew\_rate} = dV/dt = I/C \qquad (1)$$

That is, the slew rate is a rate of voltage variation with respect to time, and is proportional to current and inversely proportional to the capacity of a capacitor. Accordingly, if the current varies, the slew rate varies.

Figure 10:
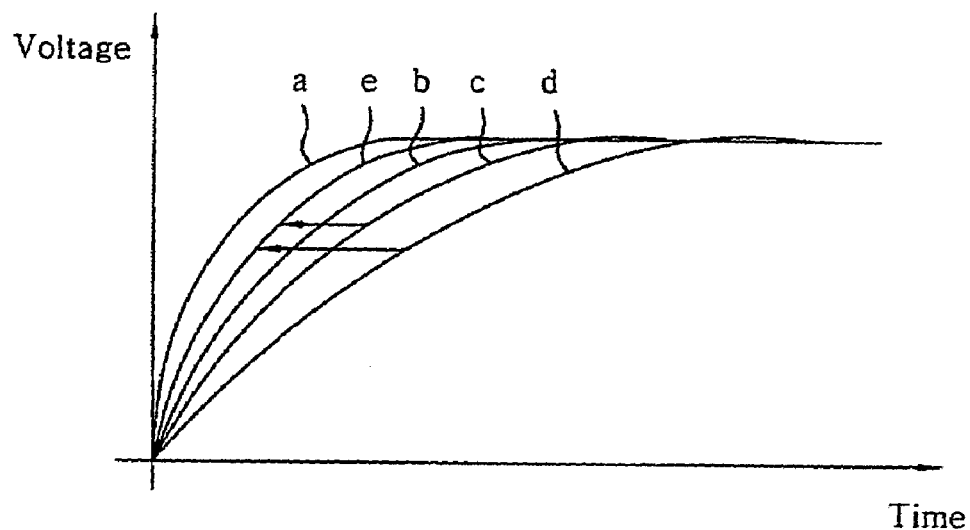
FIG. 10 is a graph showing an example illustrating the specification of FIG. 10.

It can be understood with reference to FIG. 10 that a specification of driving voltage for driving the active element of the spatial light modulator is represented by the interval between lines a and b.

In this case, it can be understood that lines c and d deviate from the required driving voltage. Accordingly, current needs to be controlled to move the lines c and d to positions between the lines a and b when the output voltage of the buffer is between the lines c and d.

For this purpose, in the present invention, a current control unit 922 is placed behind the output terminal of the amplifier 921 in the present invention, thus varying the current input to the back-stage inverting amplifier 923.

Accordingly, since the slew rate is proportional to current, the slew rate increases.

Figure 11:
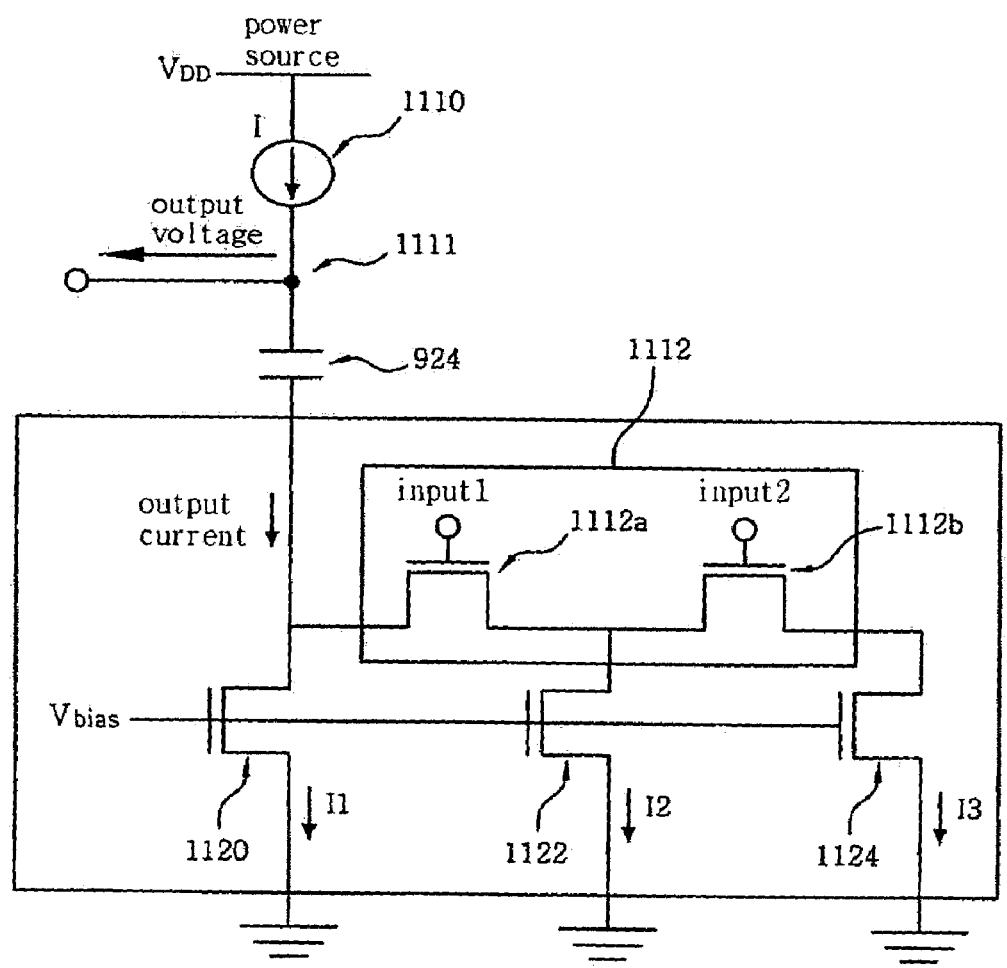
FIG. 11 is a view showing the current control unit of FIG. 9 according to the embodiment of the present invention.

FIG. 11 is a circuit diagram showing the current control unit 922 of FIG. 9 according to an embodiment of the present invention. The current control unit 922 includes a current source 1110 whose output terminal is connected to an output terminal 1111, a switching unit 1112, and a plurality of current suppliers 1120, 1122 and 1124 (in this case, MOSFETs are used as the current suppliers 1120, 1122 and 1124).

The current source 1110 enables certain current I to flow to the output terminal 1111. The capacitor C 924 functions as described above. In this case, the output current I is current flowing between the front-stage amplifier 921 and the back-stage inverting amplifier 923, and current flowing between the input terminal of the back-stage inverting amplifier 923 and the output terminal 1111. That is, the slew rate is affected by the output current I.

The switching unit 1112 is composed of, for example, a plurality of MOSFETs 1112a and 1112b. The output terminal of the front-stage amplifier 921 may be connected to the gates of the MOSFETs 1112a and 1112b. As an example, when the output terminal is connected to a gate 1, the first MOSFET 1112a is turned on, the second MOSFET 1112b is turned off, and output current I is the sum of current $I_1$ and current $I_2$. As another example, when the output terminal is connected to both gates 1 and 2, the first and second MOSFETs 1112a and 1112b are turned on, and output current I is the sum of current $I_1$, current $I_2$ and current $I_3$ in this case.

As described above, the MOSFETs 1112a and 1112b, that is, switches, function to turn on the MOSFETs 1122 and 1124 that are current suppliers connected to the source terminals of the MOSFETs 1112a and 1112b, respectively. In this case, each of the MOSFETs 1120, 1122 and 1124, which is a current supplier, has a predetermined current value. For example, the first MOSTFET 1120 has current $I_1$, the second MOSFET 1122 has current $I_2$, and the third MOSFET 1124 has current $I_3$.

Accordingly, current flowing through the current source 1110 is $I_1+I_2$ when the first MOSFET 1112a is turned on, and current flowing through the current source 1110 is $I_1+I_2+I_3$ when the second MOSFET 1112b is turned on. Meanwhile, although two switches are described for an illustrative purpose, the present invention may have a plurality of switches.

As described above, the present invention is advantageous in that it is easy to control a slew rate even in the case where it is difficult to control the slew rate in consideration of dispersion of development processes.

Furthermore, since the present invention can easily control the slew rate, the present invention enables an IC, which is inferior from the aspect of a slew rate, to exhibit desired characteristics by controlling the amount of current, thus achieving high yield.

Although an embodiment for implementing a buffer capable of controlling the slew rate in a drive IC according to the present invention has been described above, the present invention is not limited thereto and those skilled in the art will appreciate that various modifications, additions and substitutions are possible, without departing from the scope and spirit of the invention as disclosed in the accompanying claims.

What is claimed is:

1. A buffer capable of controlling a slew rate, comprising:
   a first amplifier connected to an output terminal of a Digital/Analog (D/A) converter of a drive Integrated Circuit (IC), and adapted to receive output voltage of the D/A converter and inversely amplify the output voltage;
   a second amplifier adapted to again inversely amplify output voltage that has been inversely amplified by the first amplifier;
   charging means connected to the output and input terminals of the second amplifier, and adapted to be charged with output voltage of the first amplifier; and
   a current control unit having modes of operation that are changed in response to a control signal and being connected to an output terminal of the first amplifier and the input terminal of the second amplifier, and being adapted to cooperate with said charging means to control the slew rate of the signal output by said second amplifier in a predetermined manner.

2. The buffer as set forth in claim 1, wherein the current control unit comprises:
   a current source whose output terminal is connected to the output terminal of the second amplifier and adapted to supply a predetermined amount of current;
   a plurality of parallel current suppliers provided with first terminals to be selectively connected to or disconnected from the input terminal of the second amplifier, and adapted to provide a predetermined amount of current to the input terminal of the second amplifier when the current suppliers are connected to the input terminal of the second amplifier; and
   a switching unit adapted to switch so that the first terminals of the current suppliers are selectively connected to or disconnected from the input terminal of the second amplifier, and adapted to control an amount of current flowing through the current source.

3. The buffer as set forth in claim 2, wherein the current suppliers are transistors whose first terminals are selectively connected to or disconnected from the input terminal of the second amplifier.

4. The buffer as set forth in claim 2, wherein:
   the switching unit is provided with a first terminal to be selectively connected to or disconnected from the output terminal of the first amplifier, a second terminal connected to the input terminal of the second amplifier, and a third terminal connected to a first terminal of corresponding one of the current suppliers; and the switching unit is composed of a plurality of transistors to enable the current suppliers to be connected to the input terminal of the second amplifier when the first terminal is connected to the output terminal of the first amplifier.

5. A circuit for controlling slew rate of a signal comprising:

an inverting amplifier receiving an input signal and a final output signal and generating a first output signal dependent on the difference between said input signal and said final output signal;

a current control unit generating a current dependent on said first output signal and having several modes of operation, said control unit receiving a control signal that designate a selected mode of operation from said several modes; and an integrator having an input terminal receiving said current and integrating said current to generate said final output, said integrator and said current control unit cooperating to control the slew rate of said final output in a predetermined manner.

6. The circuit as set forth in claim 5 wherein said integrator includes a second inverting amplifier having an input connected to said current control unit and an output and a feedback capacitor connected between said input and said output.

7. The circuit as set forth in claim 5, wherein the current control unit comprises:

a current source whose output terminal is connected to the output terminal of the integrator and adapted to supply a predetermined amount of current;

a plurality of parallel current suppliers provided with first terminals to be selectively connected to or disconnected from the input terminal of the integrator, and adapted to provide a predetermined amount of current to the input terminal of the integrator when the current suppliers are connected to the input terminal of the integrator; and a switching unit adapted to switch so that the first terminals of the current suppliers are selectively connected to or disconnected from the input terminal of the integrator, and adapted to control an amount of current flowing through the current source.

8. The circuit as set forth in claim 7, wherein the current suppliers are transistors whose first terminals are selectively connected to or disconnected from the input terminal of the integrator.

9. The circuit as set forth in claim 7, wherein:

the switching unit is provided with a first terminal to be selectively connected to or disconnected from the output of the first amplifier, a second terminal connected to the input terminal of the second amplifier, and a third terminal connected to a first terminal of corresponding one of the current suppliers; and the switching unit is composed of a plurality of transistors to enable the current suppliers to be connected to the input terminal of the second amplifier when the first terminal is connected to the output terminal of the first amplifier.

10. A buffer capable of controlling a slew rate, comprising:

a first amplifier connected to an output terminal of a Digital/Analog (D/A) converter of a drive Integrated Circuit (IC), and adapted to receive output voltage of the D/A converter and inversely amplify the output voltage;

a second amplifier adapted to again inversely amplify output voltage that has been inversely amplified by the first amplifier;

charging means connected to the output and input terminals of the second amplifier, and adapted to be charged with output voltage of the first amplifier; and a current control unit connected to an output terminal of the first amplifier and the input terminal of the second amplifier;

wherein the current control unit comprises:

a current source whose output terminal is connected to the output terminal of the second amplifier and adapted to supply a predetermined amount of current;

a plurality of parallel current suppliers provided with first terminals to be selectively connected to or disconnected from the input terminal of the second amplifier, and adapted to provide a predetermined amount of current to the input terminal of the second amplifier when the current suppliers are connected to the input terminal of the second amplifier; and a switching unit adapted to switch so that the first terminals of the current suppliers are selectively connected to or disconnected from the input terminal of the second amplifier, and adapted to control an amount of current flowing through the current source.

11. A buffer capable of controlling a slew rate, comprising:

a first amplifier connected to an output terminal of a Digital/Analog (D/A) converter of a drive Integrated Circuit (IC), and adapted to receive output voltage of the D/A converter and inversely amplify the output voltage;

a second amplifier adapted to again inversely amplify output voltage that has been inversely amplified by the first amplifier;

charging means connected to the output and input terminals of the second amplifier, and adapted to be charged with output voltage of the first amplifier; and a current control unit connected to an output terminal of the first amplifier and the input terminal of the second amplifier, and adapted to cooperate with said charging means to control the slew rate of the signal output by said second amplifier in a predetermined manner;

wherein said current control unit includes:

a current supply that in response to a control signal selectively generates at least one of a first and a second current to the input of said second amplifier.

* * * * *